United States Patent
Kim et al.

(10) Patent No.: US 8,482,443 B2
(45) Date of Patent: Jul. 9, 2013

(54) CLOCK TIMING ADJUSTMENT DEVICE AND CONTINUOUS TIME DELTA-SIGMA MODULATOR USING THE SAME

(75) Inventors: Yi-Gyeong Kim, Daejeon (KR); Bong Chan Kim, Seoul (KR); Min-Hyung Cho, Daejeon (KR); Jong-Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 79 days.

(21) Appl. No.: 13/184,182

(22) Filed: Jul. 15, 2011

(65) Prior Publication Data

US 2012/0098688 A1    Apr. 26, 2012

(30) Foreign Application Priority Data

Oct. 22, 2010   (KR) .................. 10-2010-0103365

(51) Int. Cl.
*H03M 3/00*     (2006.01)

(52) U.S. Cl.
USPC .......................................................... 341/143

(58) Field of Classification Search
USPC ........................ 341/118, 120, 143
See application file for complete search history.

(56) References Cited

U.S. PATENT DOCUMENTS

| | | | |
|---|---|---|---|
| 7,315,269 B2 * | 1/2008 | Schreier et al. | 341/143 |
| 7,733,673 B2 * | 6/2010 | Balakrishnan et al. | 363/21.13 |
| 2005/0110671 A1 * | 5/2005 | Lee et al. | 341/162 |
| 2007/0035426 A1 * | 2/2007 | Schreier et al. | 341/143 |
| 2008/0161035 A1 * | 7/2008 | Tomioka et al. | 455/550.1 |
| 2008/0238752 A1 * | 10/2008 | Shimizu et al. | 341/155 |
| 2008/0252506 A1 * | 10/2008 | Kuo | 341/155 |
| 2009/0085785 A1 * | 4/2009 | Gerfers et al. | 341/143 |
| 2009/0091484 A1 | 4/2009 | Weng et al. | |
| 2009/0302918 A1 * | 12/2009 | Sagisaka et al. | 327/239 |
| 2010/0066422 A1 * | 3/2010 | Tsai | 327/163 |
| 2010/0171643 A1 | 7/2010 | Hong | |

* cited by examiner

*Primary Examiner* — Linh Nguyen

(57) ABSTRACT

Provided is a clock timing adjustment device for adjusting a time difference of clocks and a delta-sigma modulator. The clock timing adjustment device includes a power detection unit and a timing adjustment unit. The power detection unit receives input signals which are generated using pairs of first and second clocks having a plurality of clock time differences and respectively correspond to the clock time differences, detects powers of the input signals, and outputs a control signal corresponding to a clock time difference where the power is minimized. The timing adjustment unit receives a reference clock and the control signal and outputs the first and second clocks having the clock time difference where the power is minimized from the reference clock according to the control signal.

11 Claims, 6 Drawing Sheets

CLOCK TIMING ADJUSTMENT DEVICE AND CONTINUOUS TIME DELTA-SIGMA MODULATOR USING THE SAME

CROSS-REFERENCE TO RELATED APPLICATIONS

This U.S. non-provisional patent application claims priority under 35 U.S.C. §119 of Korean Patent Application No. 10-2010-0103365, filed on Oct. 22, 2010, the entire contents of which are hereby incorporated by reference.

BACKGROUND OF THE INVENTION

The present invention disclosed herein relates to a delta-sigma modulator, and more particularly, to a clock timing adjustment device for adjusting a time difference of clocks and a delta-sigma modulator adopting the same.

A delta-sigma modulator is a signal converter using an analog-to-digital or digital-to-analog modulation method derived from a delta modulation method. Although this method has already been proposed in the early 1960s, it is being widely used for a wire-wireless communication with the advancement of semiconductor technology. Since a delta-sigma modulator is suitable for a multiple communication and makes it possible to implement a low-power system, the delta-sigma modulator is used for the wire-wireless communication.

Typically, the delta-sigma modulator includes circuit blocks of a Continuous Time (CT)-integrator, a Digital to Analog Converter (DAC), and a quantizer. Each circuit block generates a delay time between input and output signals. The delay time of each circuit block greatly degrades stability of the delta-sigma modulator. Particularly, it is important to compensate the delay time generated by the CT-integrator and the DAC for preventing degradation of stability and performance of the delta-sigma modulator.

SUMMARY OF THE INVENTION

The present invention provides a clock timing adjustment device for outputting first and second clocks having a certain time difference by controlling a reference clock.

The present invention also provides a clock timing adjustment device and a delta-sigma modulator for detecting a power of a delta-sigma-modulated output.

The present invention also provides a delta-sigma modulator for adjusting a time difference between a quantizer clock and a DAC clock for compensating a time delay of a CT-integrator and a DAC.

The present invention also provides a clock timing adjustment device and a delta-sigma modulator for preventing degradation of stability and performance of a delta-sigma modulator with low cost of hardware.

Embodiments of the present invention provide clock timing adjustment devices including a power detection unit configured to receive input signals which are generated using pairs of first and second clocks having a plurality of clock time differences and respectively correspond to the clock time differences, detect powers of the input signals, and output a control signal corresponding to a clock time difference where the power is minimized, and a timing adjustment unit configured to receive a reference clock and the control signal and output the first and second clocks having the clock time difference where the power is minimized from the reference clock according to the control signal.

In other embodiments of the present invention, delta-sigma modulators include a delta-sigma modulation unit configured to receive an input signal and pairs of first and second clocks having a plurality of clock time differences, modulate the input signal in a delta-sigma modulation method corresponding to the clock time differences respectively, and output the modulated signals as output signals, a power detection unit configured to receive the output signals, detect powers of the output signals, and output a control signal corresponding to a clock time difference where the power is minimized, and a timing adjustment unit configured to receive a reference clock and the control signal and output the first and second clocks having the clock time difference where the power is minimized from the reference clock according to the control signal.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
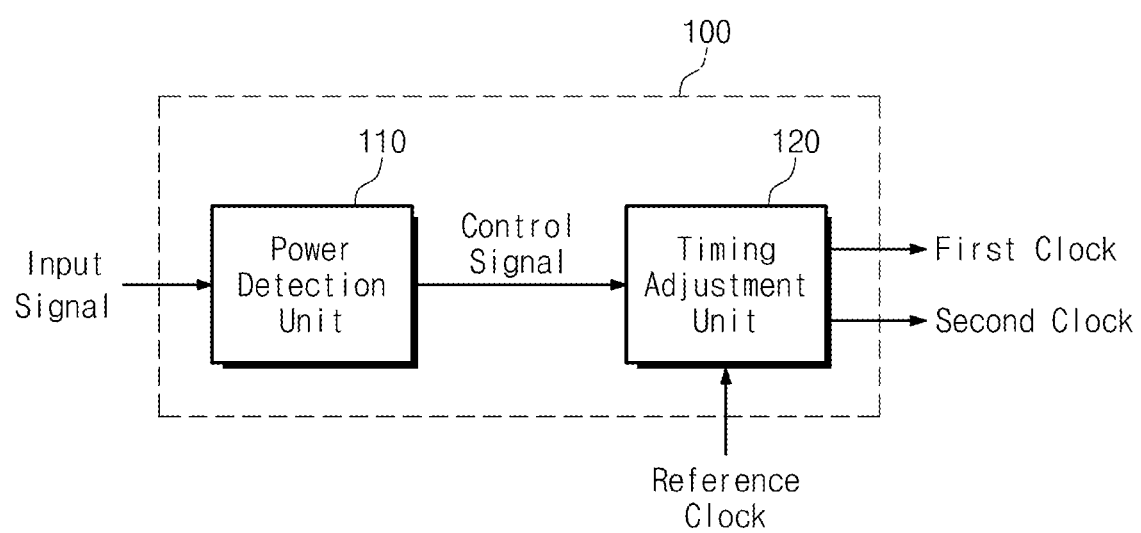
FIG. 1 is a block diagram illustrating a clock timing adjustment device according to a first embodiment of the present invention.

It should be understood that the above-described background of the invention and the following detailed description are just exemplary and provided for supplementary explanations of the claimed invention. Reference numerals are used for description of preferred embodiments of the present invention. Like reference numerals refer to like elements. Hereinafter, embodiments of the present invention will be described below in more detail with reference to the accompanying drawings Throughout the specification, when it is expressed that a certain part "includes" a certain component, the expression does not exclude inclusion of another component unless there is any contrary special comment.

Also, the terms such as " . . . unit", " . . . er", and "device" represent a unit which performs at least one function or operation. Such a unit may be implemented as hardware, software, or their combination.

A quantizer included in a delta-sigma modulator generates a large time delay and a method for compensating the delay has already been proposed. However, even though the proposed method is used, stability degradation of a DAC and a CT-integrator due to the time delay is not compensated.

If timings of a quantizer clock (sampling timing) and a DAC clock (switching timing) are correctly synchronized with each other and there is no time delay of the DAC and the CT-integrator, the delta-sigma modulator has stability and performance as designed. However, since each circuit block has a limited speed, the time delay is generated in each DAC and CT-integrator degrading stability and performance of the delta-sigma modulator. Degradation of stability of a certain system means that a pole of a transfer function of the system is moved to an unstable region (first and fourth quadrants), and energy is increased at a certain portion of a Noise Transfer Function (NTF) of the delta-sigma modulator. As a result, a high-frequency quantization noise is increased. That is, if an output power is high when an input signal is not applied, it may be determined that the stability of the delta-sigma modulator is low. Therefore, the stability of the delta-sigma modulator may be measured by detecting the power of an output signal of the delta-sigma modulator when the input signal is not applied, and the delay time of the DAC and the CT-integrator may be compensated by adjusting a time difference between the quantizer clock and the DAC clock.

1st Embodiment

FIG. 1 is a block diagram illustrating a clock timing adjustment device according to a first embodiment of the present invention. Referring to FIG. 1, a clock timing adjustment device 100 includes a power detection unit 110 and a timing adjustment unit 120.

In FIG. 1, the power detection unit 110 receives an input signal, detects a power of the input signal, and outputs a control signal. The received input signal is generated by an external device (not illustrated) of the first embodiment of the present invention using a plurality of clocks (typically two clocks) having a fixed clock time difference to be transferred to the power detection unit 110. Each input signal corresponds to each clock time difference. The power detection unit 110 detects powers of the input signals corresponding to at least two clock time differences. The powers detected from the input signals are proportional to energy on a Noise Transfer Function (NTF). Accordingly, the power detection unit 110 compares them with one another to determine the NTF of the input signal. The power detection unit 110 generates a control signal which specifies a clock time difference where the detected power is minimized and transfers the generated control signal to the timing adjustment unit 120.

In FIG. 1, the timing adjustment unit 120 receives a reference clock and the control signal and outputs first and second clocks having a clock time difference where the power is minimized according to the control signal. The control signal is information about the clock time difference in the case that the NTF of the input signal is best. The timing adjustment unit 120 generates the first and second clocks having the clock time difference where the power is minimized based on the reference clock according to the control signal and outputs the first and second clocks.

Power Detection Unit

Figure 2:
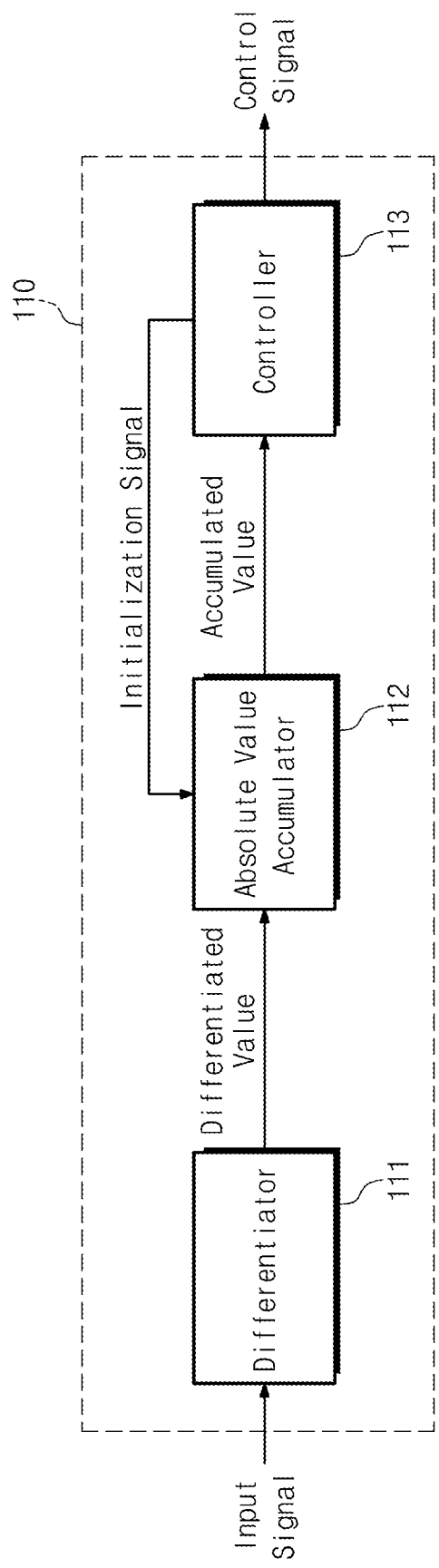
FIG. 2 is a block diagram illustrating a power detection unit of FIG. 1.

FIG. 2 is a block diagram illustrating the power detection unit 110 included in the clock timing adjustment device 100 according to the first embodiment of the present invention in detail. Referring to FIG. 2, the power detection unit 110 includes a differentiator 111, an absolute value accumulator 112, and a controller 113.

For determining the NTF of a signal, various methods of detecting the power from the signal may be used. Particularly, a correct signal power is expressed as Equation (1).

$$\text{Power} = \frac{1}{N} \sum_{i=1}^{N} D(i)^2 \qquad (1)$$

where N is the number of signals and D(i) denotes a digital signal.

Although a very correct power may be detected by performing an add operation after a square operation as expressed in Equation (1), a circuit for implementing this calculation is very complicated or large. Therefore, it is needed to simplify Equation (1) for simplification of hardware and/or software for detecting a power. The signal power may be calculated using a sum of differentiation absolute value Power_das as expressed in Equation (2).

$$\begin{aligned}\text{Power\_das} &= \sum_{i=2}^{N} \text{abs}\{D(i) - D(i-1)\} \propto \sum_{i=2}^{N} \{D(i) - D(i-1)\}^2 \\ &= \sum_{i=2}^{N} \{D(i)^2 - 2 \cdot D(i) \cdot D(i-1) - D(i-2)^2\} \\ &\cong 2 \cdot \sum_{i=2}^{N} D(i)^2 \text{ if no correlation between } D(i) \text{ and } D(i-1)\end{aligned} \qquad (2)$$

Herein, since the sum of differentiation absolute value Power_das is approximately proportional to the power of Equation (1) as shown in Equation (2), it is sufficiently possible to compare powers with one another using the sum of differentiation absolute value Power_das of Equation (2). Therefore, the signal power may be detected using Equation (2).

In FIG. 2, the differentiator 111 receives the input signal, differentiates the received input signal, and outputs the differentiated value to the absolute value accumulator 112.

In FIG. 2, the absolute value accumulator 112 receives the differentiated value, accumulates absolute values of the differentiated value, and outputs the accumulated value.

In FIG. 2, the controller 113 receives the accumulated value, initializes the absolute value accumulator 112 corresponding to each clock time difference, compares received accumulated values with one another to generate the control signal which specifies the clock time difference in the case of a minimum value, and transfers the generated control signal to the timing adjustment unit 120.

Since the differentiator 111, the absolute value accumulator 112, and the controller 113 may be implemented in various methods by those skilled in the art, detailed descriptions for them are omitted.

Also, the power detection unit 110 may be implemented through Equation (1). In this case, the power detection unit 110 may include a multiplier (not illustrated), an accumulator (not illustrated), and a controller (not illustrated). The multiplier receives an input signal, squares the input signal, and outputs the squared value to the accumulator. The accumulator receives the squared value, accumulates the squared value, and outputs the accumulated value. The controller receives the accumulated value, initializes the accumulator corresponding to each clock time difference, compares received accumulated values with one another to generate a control signal which specifies the clock time difference in the case of a minimum value, and transfers the generated control signal to the timing adjustment unit.

Timing Adjustment Unit

Figure 3:
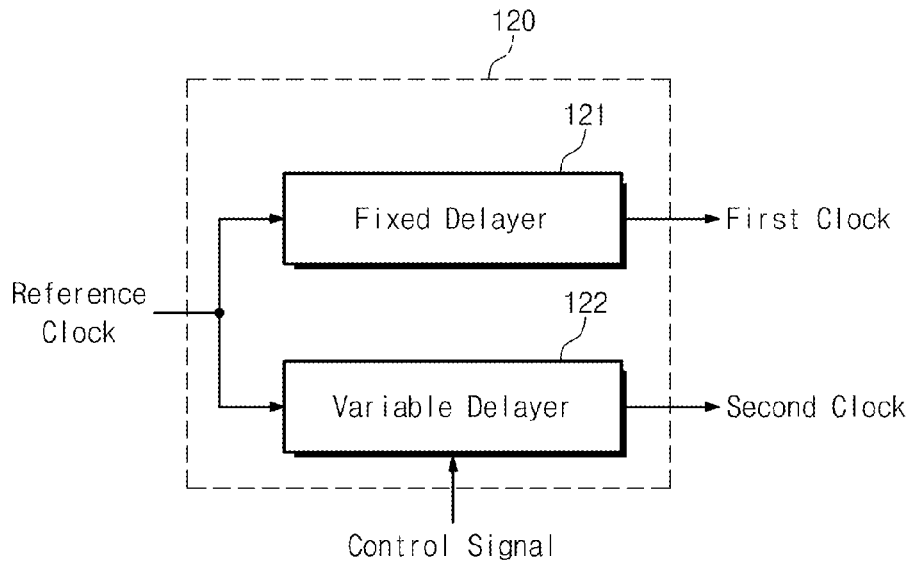
FIG. 3 is a block diagram illustrating a timing adjustment unit of FIG. 1.

FIG. 3 is a is a block diagram illustrating the timing adjustment unit 120 included in the clock timing adjustment device 100 according to the first embodiment of the present invention in detail. Referring to FIG. 3, the timing adjustment unit 120 includes a fixed delayer 121 and a variable delayer 122.

In FIG. 3, the fixed delayer 121 receives the reference clock and outputs the first clock. The fixed delayer 121 delays the received reference clock as much as an initially-configured certain time and outputs the delayed clock as the first clock.

In FIG. 3, the variable delayer 122 receives the reference clock and the control signal and outputs the second clock. The variable delayer 122 delays the received reference clock as much as a time varied according to the control signal and outputs the delayed clock as the second clock.

As a result, the timing adjustment unit 120 outputs the first and second clocks and may adjust a time difference between the first and second clocks to the clock time difference where the input signal power is minimized according to the control signal.

Variable Delayer

Figure 4:
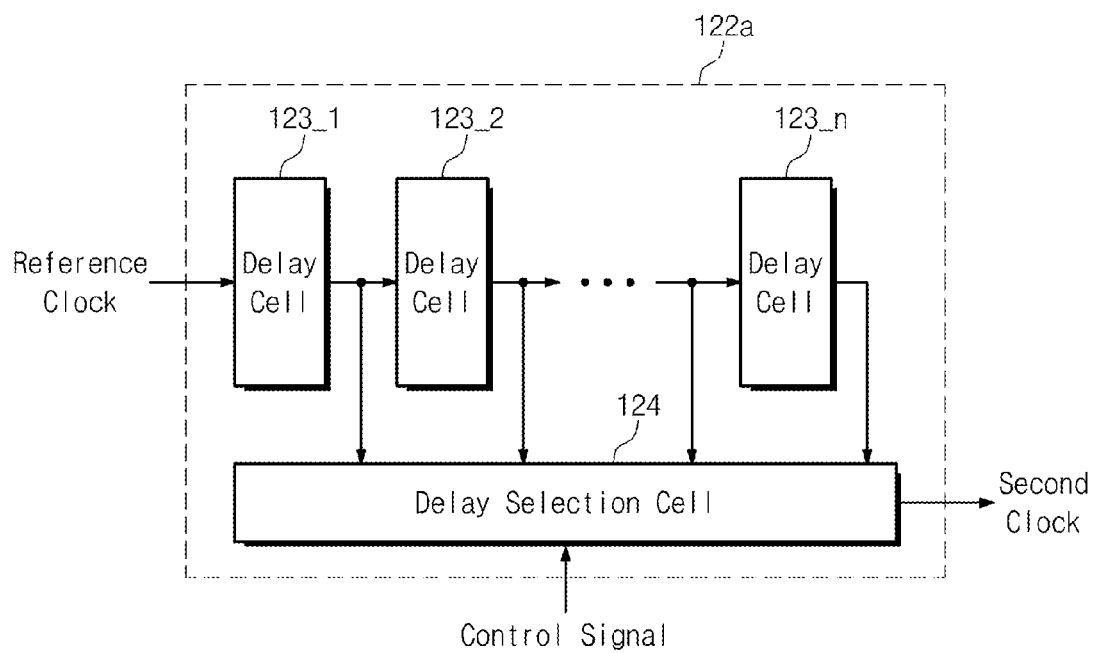
FIG. 4 is a block diagram illustrating a variable delayer of FIG. 3.

FIG. 4 is a block diagram illustrating the variable delayer included in the clock timing adjustment device 100 according to the first embodiment of the present invention in detail. Referring to FIG. 4, a variable delayer 122a includes at least two delay cells 123_1, 123_2, ..., 123_n (n is integer) and a delay selection cell 124. (n is integer)

In FIG. 4, the delay cells 123_1, 123_2, ..., 123_n are connected to each other in series. Each of the delay cells 123_1, 123_2, ..., 123_n receives a cell input signal, delays the cell input signal as much as an initially-configured certain time, and outputs the delayed signal as a cell output signal.

The cell input signal for the first delay cell 123_1 is the reference clock. The cell output signal of a preceding delay cell 123_1 is the cell input signal of a next delay cell 123_2. Also, each cell output signal is transferred to the delay selection cell 124.

In FIG. 4, the delay selection cell 124 receives the cell output signals of the delay cells 123_1, 123_2, ..., 123_n and the control signal and outputs the second clock. The delay selection cell 124 outputs one of the received cell output signals as the second clock according to the received control signal. Therefore, the variable delayer 122a may delay the reference clock as much as a desired time according to the control signal and output the delayed clock as the second clock.

As a result, the timing adjustment unit 120 may variably adjust the clock time difference between the second clock outputted from the variable delayer 122a of FIG. 4 and the first clock outputted from the fixed delayer 121 of FIG. 3 as much as desired.

Figure 5:
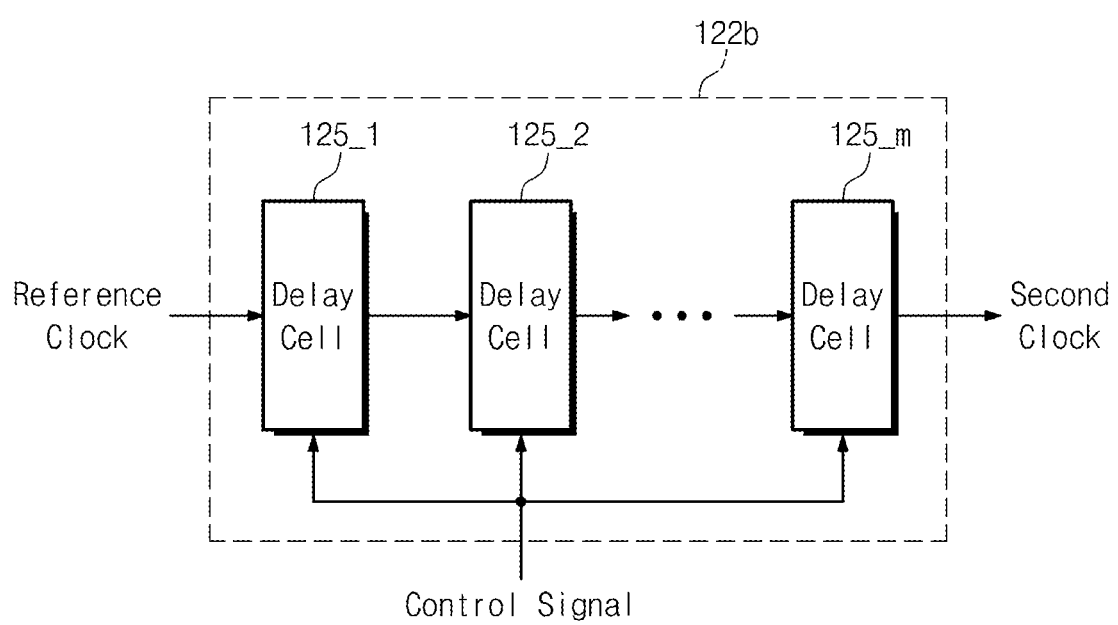
FIG. 5 is a block diagram illustrating another variable delayer of FIG. 3.

FIG. 5 is a block diagram illustrating another structure of the variable delayer included in the clock timing adjustment device 100 according to the first embodiment of the present invention. Referring to FIG. 5, a variable delayer 122b includes at least two delay cells 125_1, 125_2, ..., 125_m (m is integer).

In FIG. 5, the delay cells 125_1, 125_2, ..., 125_m are connected to each other in series. Each of delay cells 125_1, 125_2, ..., 125_m receives a cell input signal and the control signal, delays the cell input signal as much as a time varied according to the control signal, and outputs the delayed signal as a cell output signal. The cell input signal for the first delay cell 125_1 is the reference clock. The cell output signal of a preceding delay cell 125_1 is the cell input signal of a next delay cell 125_2. The cell output signal of the last delay cell 125_m is the second clock. Therefore, the variable delayer 122b may delay the reference clock as much as a desired time according to the control signal and output the delayed clock as the second clock.

As a result, the timing adjustment unit 120 may variably adjust the clock time difference between the second clock outputted from the variable delayer 122b of FIG. 5 and the first clock outputted from the fixed delayer 121 of FIG. 3 as much as desired.

2nd Embodiment

Figure 6:
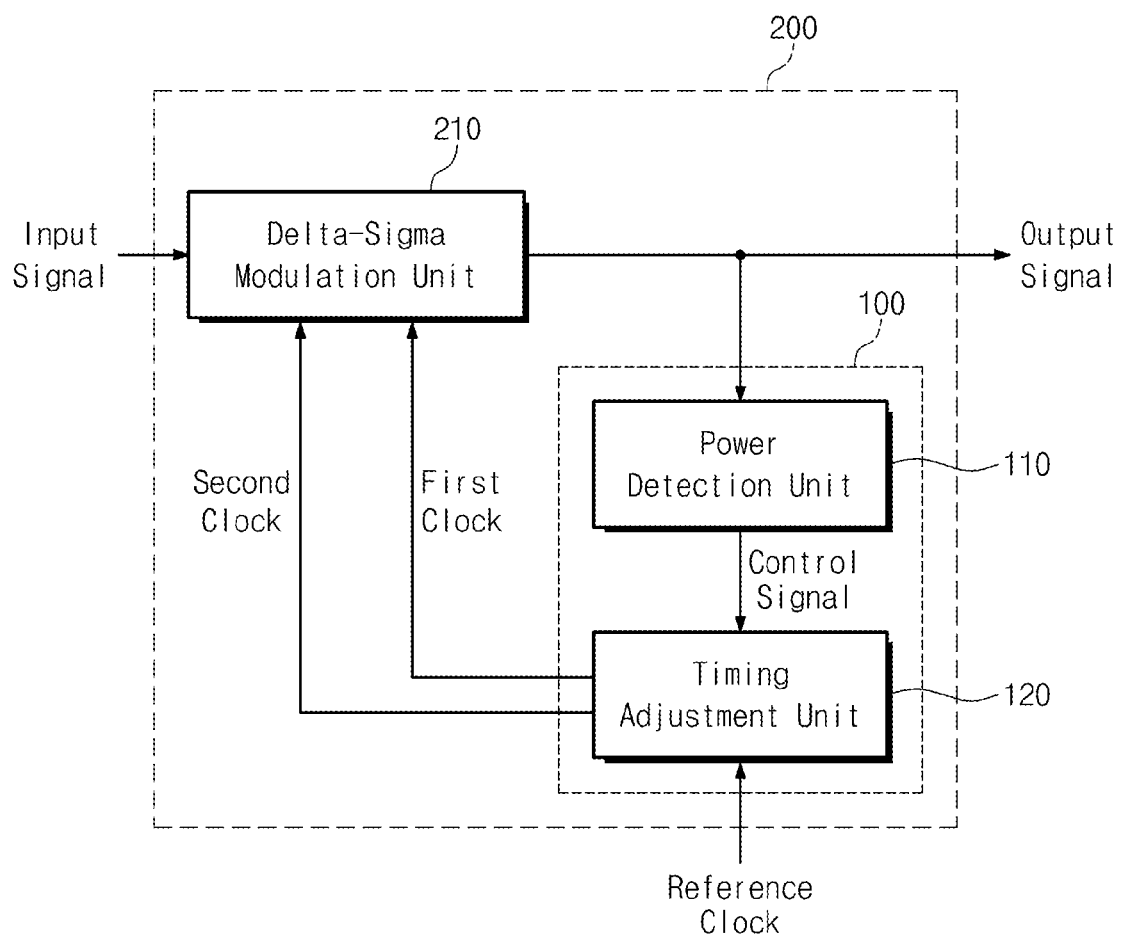
FIG. 6 is a block diagram illustrating a delta-sigma modulator according to a second embodiment of the present invention.

FIG. 6 is a block diagram illustrating a delta-sigma modulator according to a second embodiment of the present invention. Referring to FIG. 6, a delta-sigma modulator 200 includes a delta-sigma modulation unit 210 and a clock timing adjustment device 100. The clock timing adjustment device 100 includes a power detection unit 110 and a timing adjustment unit 120.

In FIG. 6, the delta-sigma modulation unit 210 receives an input signal and first and second clocks, modulates the input signal in a delta-sigma modulation method, and outputs the modulated signal as an output signal. The first and second clocks have at least two clock time differences. In the case that the delta-sigma modulation unit 210 is a delta-sigma Analog to Digital Converter (ADC), the input signal is an analog signal and the output signal is a digital signal. On the contrary, in the case that the delta-sigma modulation unit 210 is a delta-sigma Digital to Analog Converter (DAC), the input signal is a digital signal and the output signal is an analog signal. The output signal (digital or analog signal) is transferred to the clock timing adjustment device 100.

In detail, in the case that the delta-sigma modulation unit 210 is the delta-sigma ADC, the first and second clocks are respectively quantizer clock and DAC clock or DAC clock and quantizer clock. Each digital clock corresponds to a particular clock time difference and is transferred to the clock timing adjustment device 100.

In FIG. 6, the power detection unit 110 included in the clock timing adjustment device 100 receives the digital signal of the delta-sigma modulation unit 210, detects a power of the received digital signal corresponding to each clock time difference, generates a control signal corresponding to the clock time difference where the power is minimized, and transfers the control signal to the timing adjustment unit 120.

In FIG. 6, the timing adjustment unit 120 receives the control signal and a reference clock and generates the first and second clocks having the clock time difference where the power is minimized by delaying the reference clock according to the control signal.

Since the case that the delta-sigma modulation unit 210 is the delta-sigma DAC may be easily understood through the above-described delta-sigma ADC, detailed descriptions for this case are omitted.

In FIG. 6, detailed structures and descriptions for the power detection unit 110 and the timing adjustment unit 120 are the same as described above referring to FIGS. 1 to 5.

As a result, the delta-sigma modulator 200 detects the power of the output signal to be operated with the quantizer clock and the DAC clock having the best clock time difference for the NTF of the delta-sigma modulator 200. That is, the delta-sigma modulator 200 according to the embodiment of the present invention may prevent the degradation of stability and performance due to the time delay generated by the CT-integrator (not illustrated) and the DAC (not illustrated) unlike a typical delta-sigma modulator. Also, the time difference between the quantizer clock and the DAC clock of the delta-sigma modulator 200 according to the embodiment of the present invention is not a predetermined fixed value but a variable value which is adjusted during modulation. The time difference between the quantizer clock and the DAC clock is automatically adjusted through a modulation process.

Also in FIG. 6, the input sigma may be a particular signal, but it is not limited thereto. In the case that the input signal is eliminated for analyzing the NTF of the delta-sigma modulator 200, the output signal of FIG. 6 does not respond to the particular input signal but responds to a noise signal.

Figure 7:
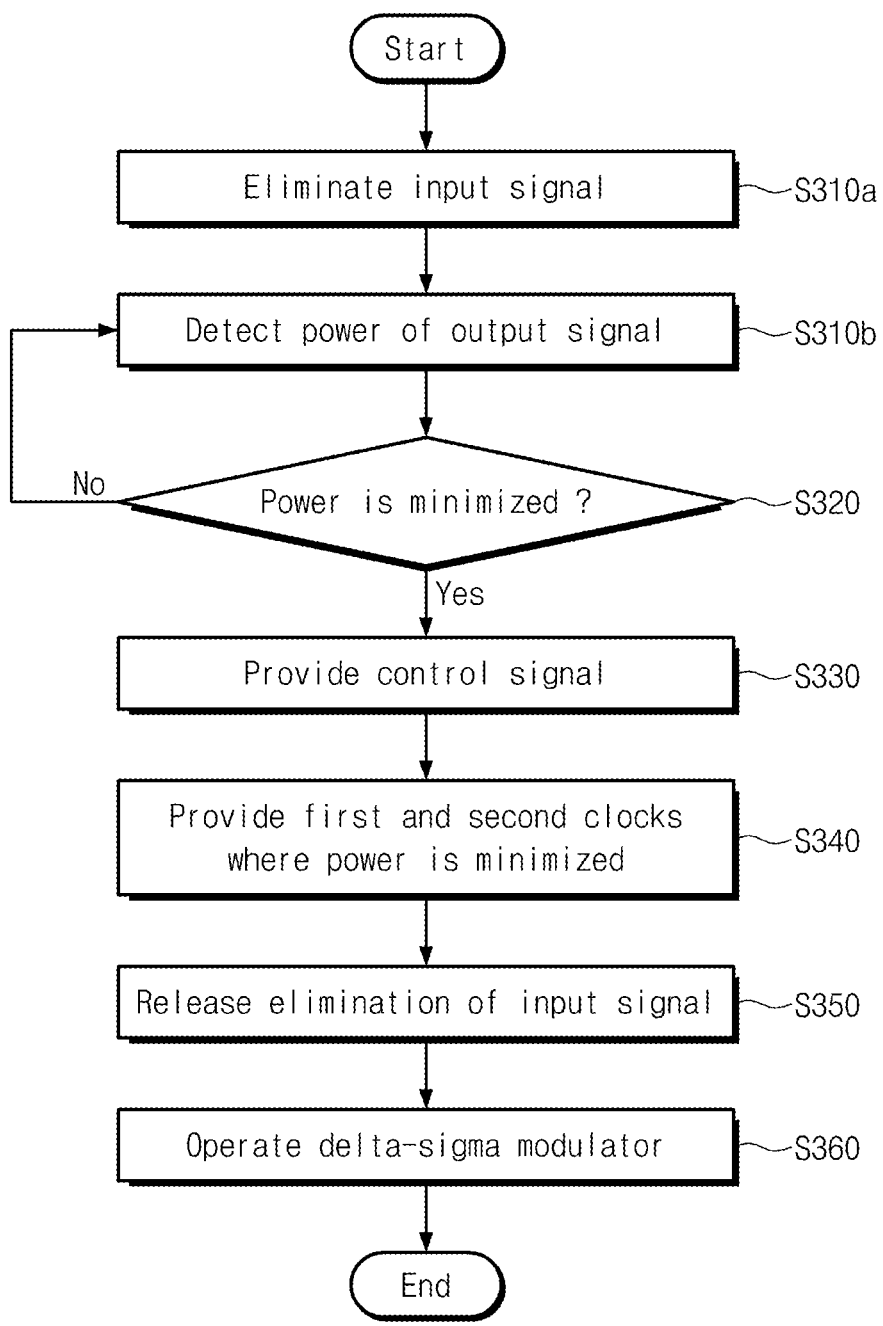
FIG. 7 is a flowchart illustrating an operation of the delta-sigma modulator according to the second embodiment of the present invention.

FIG. 7 is a flowchart illustrating an operation of the delta-sigma modulator according to the second embodiment of the present invention in the case of eliminating the input signal for analyzing the NTF. Referring to FIG. 7, the input signal is eliminated in operation S310a. In operations S310b, the power of the output signal is detected. In operation S320, it is determined whether the power is minimized. In operation S330, the control signal is provided. In operation S340, the first and second clocks are provided. In operation S350, the input signal is eliminated. In operation S360, the delta-sigma modulator is operated 360.

According to the embodiments of the present invention, the first and second clocks having a certain time difference are outputted controlling the reference clock.

Also, the power of the delta-sigma-modulated output is detected.

Also, the time difference between the quantizer clock and the DAC clock is adjusted for compensating the time delay of the CT-integrator and the DAC.

Also, the degradation of stability and performance of the delta-sigma modulator can be prevented with low cost of hardware.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A clock timing adjustment device, comprising:
a power detection unit configured to receive input signals which are generated using pairs of first and second clocks having a plurality of clock time differences and respectively correspond to the clock time differences, detect powers of the input signals, and output a control signal corresponding to a clock time difference where the power is minimized; and
a timing adjustment unit configured to receive a reference clock and the control signal and output the first and second clocks having the clock time difference where the power is minimized from the reference clock according to the control signal,
wherein the power detection unit comprises:
a differentiator configured to differentiate the input signals and output differentiated values;
an absolute value accumulator configured to receive the differentiated values, accumulate absolute values of the differentiated values, and output accumulated values corresponding to the clock time differences; and
a controller configured to receive the accumulated values, initialize the absolute value accumulator, and output a control signal corresponding to the clock time difference where the accumulated value is minimized.

2. The clock timing adjustment device of claim 1, wherein the timing adjustment unit comprises:
a fixed delayer configured to receive the reference clock and output the first clock generated by delaying the reference clock as much as a fixed time; and
a variable delayer configured to receive the reference clock and the control signal and output the second clock generated by delaying the reference clock as much as a time varied according to the control signal.

3. The clock timing adjustment device of claim 2, wherein the variable delayer comprises:
at least two delay cells each of which is configured to receive a cell input signal and output a cell output signal generated by delaying the cell input signal as much as a certain time; and
a delay selection cell configured to receive the cell output signals and the control signal and output one of the cell output signals according to the control signal,
wherein the delay cells are connected to each other in series, the cell input signal for a first delay cell of the serially connected delay cells is the reference clock, and the output signal of the delay selection cell is the second clock.

4. The clock timing adjustment device of claim 2, wherein the variable delayer comprises:
at least two delay cells each of which is configured to receive an cell input signal and the control signal and output a cell output signal generated by delaying the cell input signal as much as a time varied according to the control signal, wherein the delay cells are connected to each other in series, the cell input signal for a first delay cell of the serially connected delay cells is the reference clock, and the output signal of a last delay cell of the serially connected delay cells is the second clock.

5. A delta-sigma modulator, comprising:
a delta-sigma modulation unit configured to receive an input signal and pairs of first and second clocks having a plurality of clock time differences, modulate the input signal in a delta-sigma modulation method corresponding to the clock time differences respectively, and output the modulated signals as output signals;
a power detection unit configured to receive the output signals, detect powers of the output signals, and output a control signal corresponding to a clock time difference where the power is minimized; and
a timing adjustment unit configured to receive a reference clock and the control signal and output the first and second clocks having the clock time difference where the power is minimized from the reference clock according to the control signal;
wherein the power detection unit comprises:
a differentiator configured to differentiate the input signals and output differentiated values;
an absolute value accumulator configured to receive the differentiated values, accumulate absolute values of the differentiated values, and output accumulated values corresponding to the clock time differences; and
a controller configured to receive the accumulated values, initialize the absolute value accumulator, and output a control signal corresponding to the clock time difference where the accumulated value is minimized.

6. The delta-sigma modulator of claim 5, wherein the timing adjustment unit comprises:
a fixed delayer configured to receive the reference clock and output the first clock generated by delaying the reference clock as much as a fixed time; and a variable delayer configured to receive the reference clock and the control signal and output the second clock generated by delaying the reference clock as much as a time varied according to the control signal.

7. The delta-sigma modulator of claim 6, wherein the variable delayer comprises:

at least two delay cells each of which is configured to receive a cell input signal and output a cell output signal generated by delaying the cell input signal as much as a certain time; and a delay selection cell configured to receive the cell output signals and the control signal and output one of the cell output signals according to the control signal, wherein the delay cells are connected to each other in series, the cell input signal for a first delay cell of the serially connected delay cells is the reference clock, and the output signal of the delay selection cell is the second clock.

8. The delta-sigma modulator of claim 6, wherein the variable delayer comprises:

at least two delay cells each of which is configured to receive an cell input signal and the control signal and output a cell output signal generated by delaying the cell input signal as much as a time varied according to the control signal, wherein the delay cells are connected to each other in series, the cell input signal for a first delay cell of the serially connected delay cells is the reference clock, and the output signal of a last delay cell of the serially connected delay cells is the second clock.

9. The delta-sigma modulator of claim 5, wherein the first and second clocks are respectively a quantizer clock and a Digital to Analog Converter (DAC) clock or a DAC clock and a quantizer clock.

10. The delta-sigma modulator of claim 5, further comprising an input control unit configured to control whether to input the input signal received by the delta-sigma modulation unit.

11. A clock timing adjustment device, comprising:

a power detection unit configured to receive input signals which are generated using pairs of first and second clocks having a plurality of clock time differences and respectively correspond to the clock time differences, detect powers of the input signals, and output a control signal corresponding to a clock time difference where the power is minimized; and a timing adjustment unit configured to receive a reference clock and the control signal and output the first and second clocks having the clock time difference where the power is minimized from the reference clock according to the control signal, wherein the power detection unit comprises:

a multiplier configured to square the input signals and output squared values;

an accumulator configured to receive the squared values, accumulate the squared values, and output accumulated values corresponding to the clock time differences; and a controller configured to receive the accumulated values, initialize the accumulator, and output a control signal corresponding to the clock time difference where the accumulated value is minimized.

* * * * *